(12) United States Patent
Ichihara

(10) Patent No.: US 6,275,699 B1
(45) Date of Patent: *Aug. 14, 2001

(54) MOBILE COMMUNICATION TERMINAL FOR RAPID ADJUSTMENT OF A REFERENCE FREQUENCY TO A TARGET FREQUENCY

(75) Inventor: Masaki Ichihara, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/970,803

(22) Filed: Nov. 14, 1997

(30) Foreign Application Priority Data

Nov. 28, 1996 (JP) .................................................. 8-317543

(51) Int. Cl.[7] ........................................................ H04Q 7/32
(52) U.S. Cl. ........................ 455/434; 455/515; 455/164.1
(58) Field of Search .............................. 455/432, 434, 455/550, 515, 165.2, 164.1, 164.2, 165.1

(56) References Cited

U.S. PATENT DOCUMENTS

| | | | |
|---|---|---|---|
| 5,457,816 | 10/1995 | Koyama | 455/161.2 |
| 5,613,208 | * 3/1997 | Blackman et al. | 455/434 |
| 5,710,973 | * 1/1998 | Yamada et al. | 455/434 |
| 5,794,147 | * 8/1998 | Huang | 455/434 |
| 5,809,419 | * 9/1998 | Schellinger et al. | 455/515 |

FOREIGN PATENT DOCUMENTS

| | | |
|---|---|---|
| 0 551 106 A2 | 1/1993 | (EP) . |
| 0 624 948 A1 | 4/1994 | (EP) . |
| 6-326740 | 11/1994 | (JP) . |

* cited by examiner

*Primary Examiner*—Edward F. Urban
(74) *Attorney, Agent, or Firm*—Foley & Lardner

(57) ABSTRACT

In a mobile communication terminal, a switch 10 is initially set to an initial setting mode at time of turning on a power supply. A reference oscillator control circuit is initialized, and in this state, the output frequency of a reference oscillator is usually greatly shifted. The base station search is first conducted, and as a result, if the base station cannot be grasped, an offset signal is generated by a frequency offset generating circuit 12, to shift the output frequency of a reference oscillator 6 through a reference oscillator control circuit 5. This operation is repeated until the base station is grasped so that the base station search is continued while the output frequency of the reference oscillator 6 is being shifted. When a grasp of the base station succeeds, the switch 10 is switched to an AFC side to conduct automatic frequency adjustment.

9 Claims, 3 Drawing Sheets

MOBILE COMMUNICATION TERMINAL FOR RAPID ADJUSTMENT OF A REFERENCE FREQUENCY TO A TARGET FREQUENCY

BACKGROUND OF THE INVENTION

The present invention relates to a terminal of a mobile communication system which is capable of performing automatic frequency control (AFC) for the first time when a receive signal is normally demodulated as in a code division multiple access (CDMA) system, and more particularly to a technique by which a transmit frequency of a reference oscillator is adjusted.

In recent mobile communication systems, there has been used a high frequency of 900 MHz to several GHz. For that reason, even though a high-accuracy TCXO (temperature compensated crystal oscillator) which is about 3 ppm in frequency error is employed, a frequency error of 3 kHz or more may occur. However, because such a frequency error makes it difficult to demodulate a receive signal, a higher accuracy of the TCXO is being studied. On the contrary, a demand for the higher accuracy brings an expensive mobile communication terminal. Under those circumstances, there is required a technique by which a reference frequency that is oscillated by the TCXO is adjusted in conformity with the receive signal.

A conventional example for adjusting the reference frequency in conformity the receive signal is disclosed, for example, in Japanese Patent Unexamined Publication No. Hei 6-326740. FIG. 1 is a block diagram for explanation of this conventional example.

In FIG. 1, a receive wave received by an antenna 1 is converted in frequency into an intermediate frequency band signal and then inputted to a demodulator 3. The intermediate frequency band signal which has been inputted to the demodulator 3 contains a frequency error based on the output frequency error of a reference oscillator 6. The demodulator 3 demodulates the intermediate frequency band signal to output demodulated data as well as frequency data indicative of a frequency of a regenerative carrier wave. The frequency data is supplied to a frequency error detecting circuit 4.

The frequency error detecting circuit 4 detects a frequency error between the frequency data and a frequency of a predetermined intermediate frequency band signal. A detection output from the frequency error detecting circuit 4 is supplied to a reference oscillator control circuit 5. The reference oscillator control circuit 5 produces a frequency error compensation signal (a reference oscillator control signal) for compensating the frequency error and inputs the frequency error compensation signal to a reference oscillator 6 to control the transmit frequency of the reference oscillator 6 until the frequency error becomes a predetermined value or less, thus conducting stabilizing operation. The frequency error detecting circuit 4 may be formed of a frequency counter or the like. The reference oscillator 6 outputs a signal as a reference of the output frequency of a frequency synthesizer.

As mentioned above, the conventional system employs a method in which the frequency error is detected by some manner, and the detected frequency error is fed back to the output frequency of the reference oscillator, to thereby reduce the frequency error.

By the way, in a mobile communication system using a CDMA which is represented by IS95 system of U.S.A., or the like, a spread spectrum system is used as the modulation system, and a channel is determined by a spread code. Therefore, a plurality of code channels exist in the identical frequency channel so that signals different from each other are transmitted through the respective code channels. Also, since base stations also use the identical frequency channel, various base stations and code channels are mixed in an electric wave which is received by a terminal. This is largely different between the normal analog system or TDMA-digital system and the CDMA system.

Therefore, the CDMA system is required to extract a signal transmitted to an operator from a plurality of signals contained in the identical frequency channel. To achieve this, complicated processing such as base station search, synchronization or spectrum de-spreading are required.

There is proposed that the conventional frequency adjusting method is used in the CDMA system. This method suffers from a first problem that the frequency error can be detected for the first time after all of the complicated processing such as base station search, synchronization or spectrum de-spreading has been well performed. In other words, the processing such as base station search, synchronization or spectrum de-spreading must be well performed before frequency adjustment is conducted.

The case where the conventional frequency adjusting method is used in the CDMA system also suffers from a second problem that an error in the reference frequency must be sufficiently small in order to normally conduct the processing such as the base station search, synchronization or spectrum de-spreading.

As mentioned above, the first and second problems have no order of priority, and are contradictory to each other in that one of those problems cannot be solved without the solution of the other problem.

SUMMARY OF THE INVENTION

The present invention has been made to solve the above problems with the conventional system, and therefore an object of the present invention is to provide a technique by which an error in frequency is well squeezed from an initial state where a power supply is switched on, and a base station is grasped.

In order to achieve the above object, according to the present invention, there is provided a mobile communication terminal, which comprises:

a receive circuit for receiving an electric wave which is transmitted from a base station;

local signal generating means for outputting a local signal to the receive circuit;

a reference oscillator for transmitting a reference signal indicative of a reference of an oscillation frequency of the local signal generating means;

reference oscillator control means for generating a control signal that controls the transmit frequency of the reference oscillator;

demodulating means for demodulating a signal received by the receive circuit;

base station search means that inputs a demodulated signal outputted from the demodulating means for searching an identifying signal indicative of the base station which is included in the demodulated signal to detect the presence/absence of the base station; and frequency offset generating means that changes the control signal generated by the reference oscillator control means according to a search result of the base station search means for offsetting the transmit frequency of the reference signal oscillator.

Also, in the case where the identifying signal indicative of the base station can be correctly detected by the base station search means, the base station search means stops the frequency offset generating means from offsetting the transmit frequency of the reference signal oscillator.

The mobile communication terminal further includes frequency error detecting means that inputs the demodulated signal outputted from the demodulating means for detecting an error in the frequency of the reference oscillator, wherein after a function of offsetting the output frequency of the reference signal oscillator by the frequency offset generating means is stopped, the control signal generated by the reference oscillator control means is produced according to a frequency error signal outputted by the frequency error detecting means to control the transmit frequency of the reference signal oscillator.

Moreover, in one mode of the present invention, the mobile communication terminal includes, in addition to the above structural elements, storage means for storing the control signal which is outputted to the reference oscillator control means so that data stored in the storage means can be used as an initial value of the control signal at the time of turning on a power supply of the moving communication terminal.

The mobile communication terminal according to the present invention is designed such that the frequency is adjusted on a terminal of the moving communication system which is required for conducting complicated processing such as base station search, synchronization or spectrum de-spreading to demodulate the receive signal, as in the CDMA system, under the condition where an optimum control state of the circuit at the time of turning on the power supply, etc., is unknown. As means for performing this, the moving communication terminal of the present invention includes a base station search circuit for detecting an identifying signal indicative of the base station.

In turning on the power supply, the base station search circuit is operated to search the presence/absence of the base station. In the case where the base station is not detected, the reference frequency is shifted by a predetermined frequency to again search the base station. This process is continued until the base station is found out, to thereby naturally adjust the reference frequency.

The above and other objects and features of the present invention will be more apparent from the following description taken in conjunction with the accompanying drawings.

DETAILED DESCRIPTION OF THE PREFERRED EMBODIMENTS

Now, descriptions will be given in more details of a preferred embodiment of the present invention with reference to the accompanying drawings.

Figure 1:
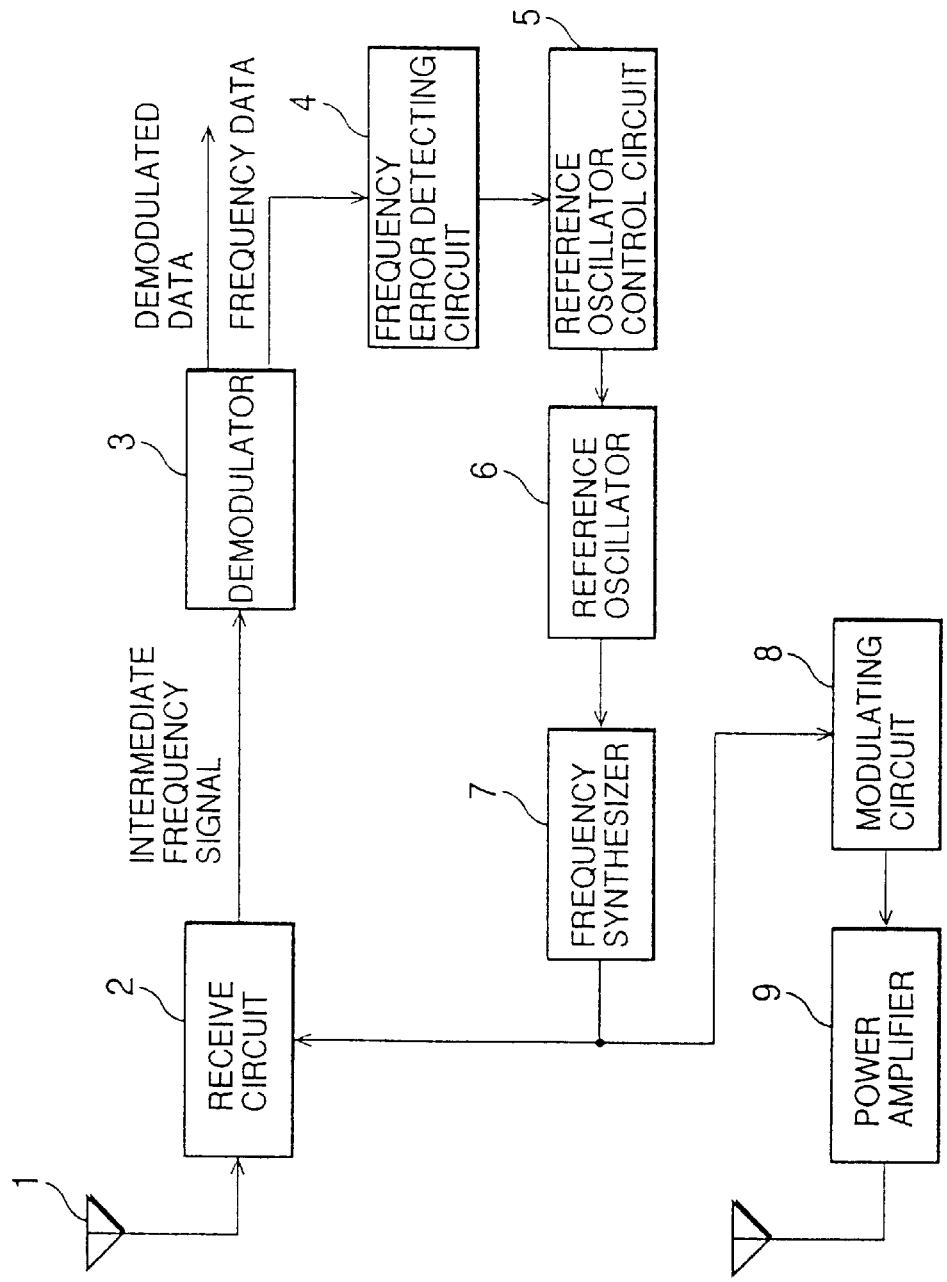
FIG. 1 is a block diagram showing a structure of a conventional mobile communication terminal.
Figure 2:
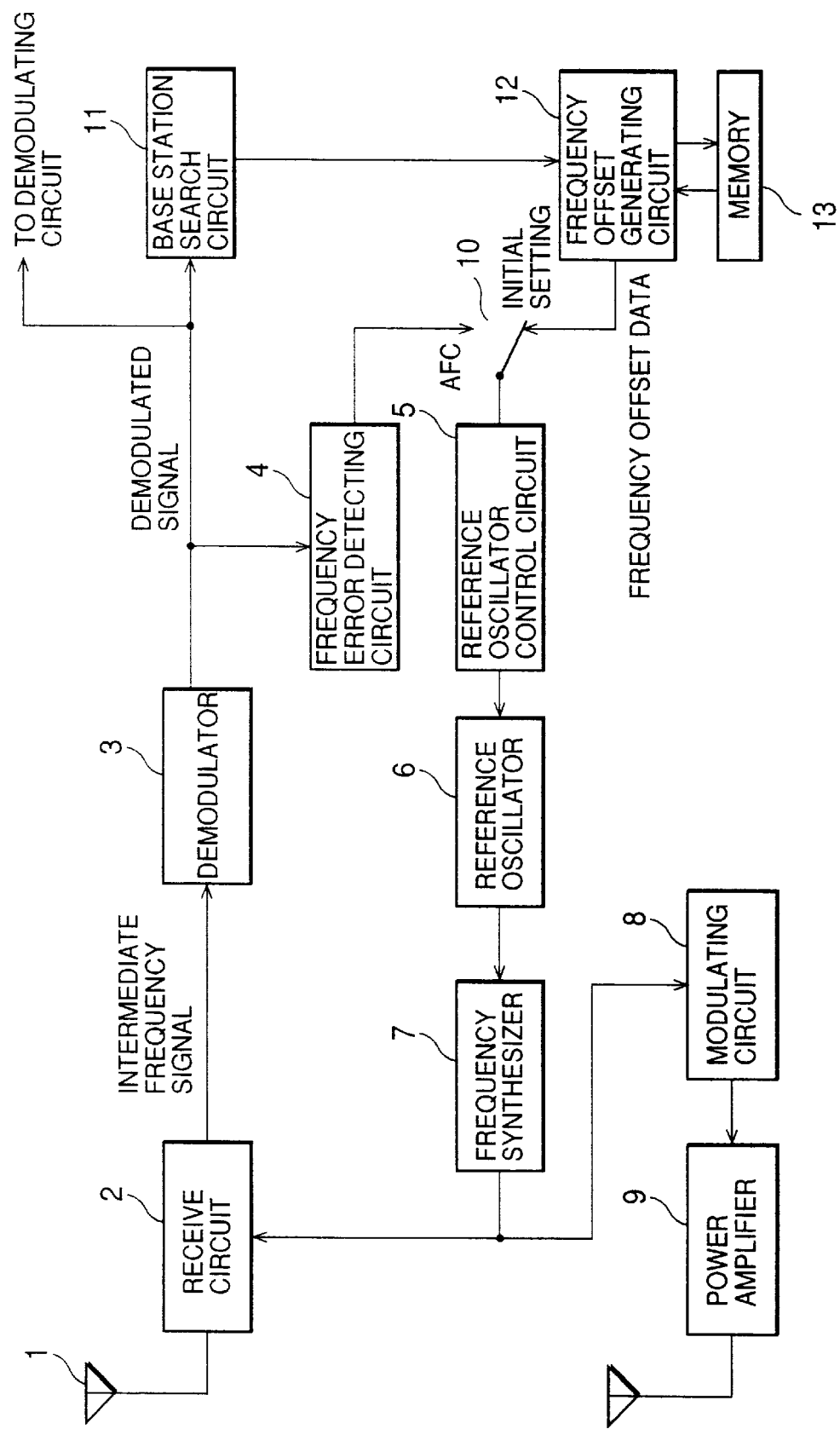
FIG. 2 is a block diagram showing a mobile communication terminal according to a preferred embodiment of the present invention.

FIG. 2 is a block diagram showing a mobile communication terminal according to a preferred embodiment of the present invention. As is apparent from the comparison of FIG. 1 with FIG. 2, this embodiment is different from the prior art shown in FIG. 1 in that there are provided a base station search circuit 11 and a frequency offset generating circuit 12 that operates according to its search result. Also, this embodiment is different from the prior art in there is provided a switch 10 for switching the operation of adjusting a reference oscillator in an initial state at the time of turning on a power supply to the frequency adjusting operation of the conventional system using the frequency error detector, after the base station is grasped, synchronization is established, and spectrum de-spreading is enabled. Other differences between the present invention and the prior art except for the above differences become apparent as a description goes ahead.

Figure 3:
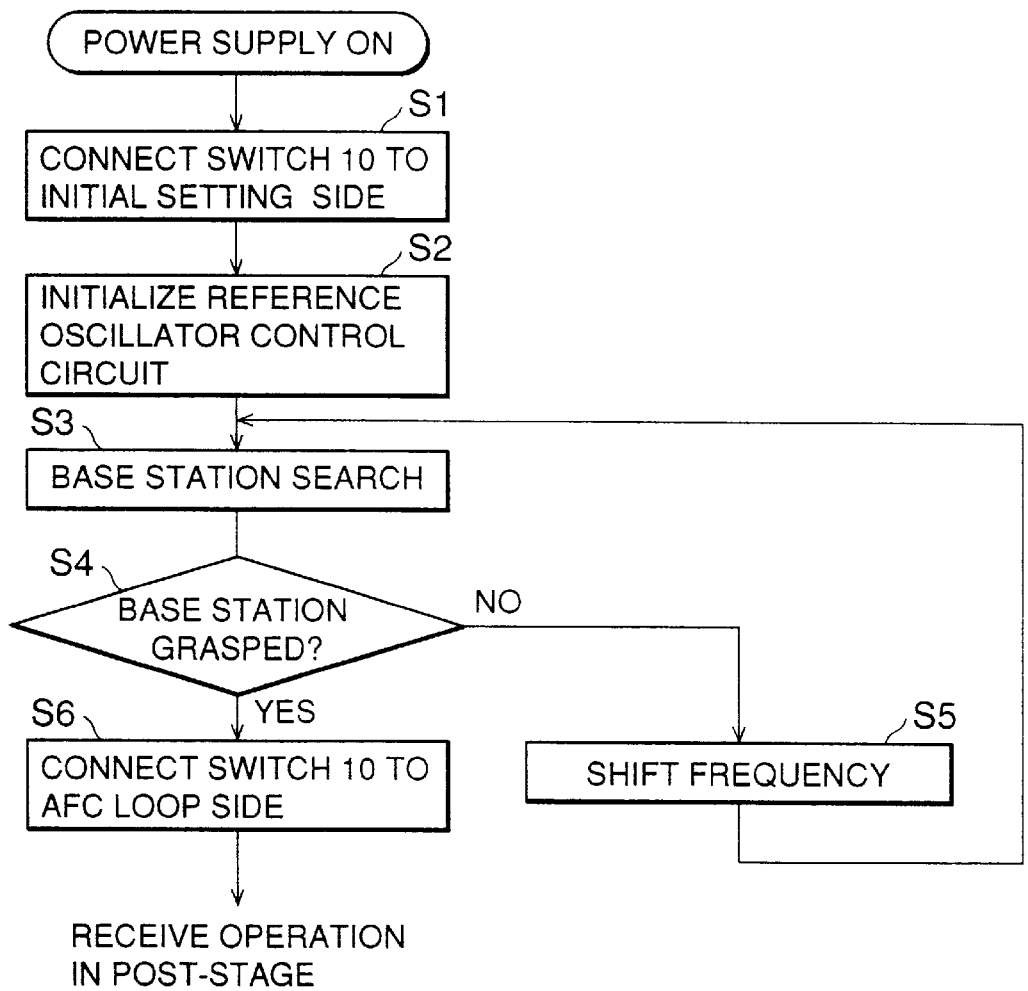
FIG. 3 is a flowchart for explanation of the operation of the mobile communication terminal according to the present invention.

FIG. 3 is a flowchart for explanation of the operation of the mobile communication terminal shown in FIG. 2. Referring mainly to FIGS. 1 and 3, a preferred embodiment of the present invention will be described in more detail. It should be noted that the detailed description of parts which are not changed from those of the prior art in FIG. 1 will be omitted here.

At an initial state where a power supply is turned on, the switch 10 is connected to an initial setting side, that is, an output of a frequency offset generating circuit 12 (Step S1 in FIG. 3), which is set to an initial setting mode. A reference oscillator control circuit 5 is initialized (Step S2 in FIG. 3), and in this state, the output frequency of the reference oscillator is usually greatly shifted from the frequency of a receive signal.

Figure 4:
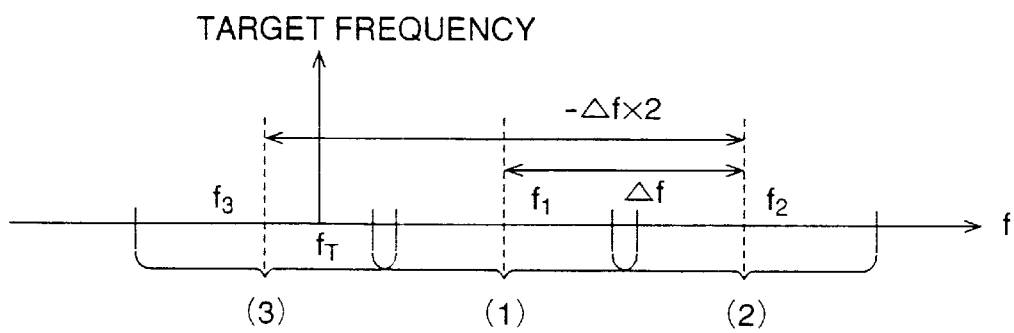
FIG. 4 is an explanatory diagram showing an appearance of the adjustment of a reference oscillator.

FIG. 4 shows its appearance. For example, the frequency of a reference oscillator 6 is $f_1$ with respect to a target frequency $f_T$. A range indicated by reference symbol (1) in the figure is representative of a range in which a base station search is enabled when the frequency of the reference oscillator is $f_1$.

In this state, a base station search is first conducted (Step S3 in the figure). As a result, if the base station could not be grasped, an offset signal corresponding to a frequency $\Delta f$ is generated by a frequency offset generating circuit 12, and the output frequency of the reference oscillator 6 is shifted to $f_2$ through the reference oscillator control circuit 5 in Step S5.

With the above operation, the range in which the base station search is enabled becomes a range (2). At this stage, the base station search is again conducted. In FIG. 4, since no target frequency $f_T$ is contained in the range (2), the base station search is again in failure. At the next time, the frequency offset generating circuit 12 is again allowed to generate an offset signal corresponding to (frequency−2×$\Delta f$) in Step S5, and the output frequency of the reference oscillator 6 is shifted to $f_3$ through the reference oscillator control circuit 5. As a result, the range in which the base station search is enabled becomes a range (3) of FIG. 4. In this situation, if the base station search is further conducted, since the target frequency $f_T$ is contained in the range (3) in FIG. 4, the base station can be grasped. On the contrary, if the base station could not be grasped even in the range (3), the offset signal corresponding to 2×$\Delta f$ is now supplied in step S5.

If a grasp of the base station succeeds, the switch 10 is switched to an AFC side in step S6, the conventional automatic frequency control as was described with reference to FIG. 1 is started.

Also, a control signal which is obtained by frequency adjustment which has been conducted during the previous operation, that is, a control signal which is obtained when the grasp of the base station succeeds is stored in a memory 13, so that it can be utilized as an initial value of a succeeding initial frequency adjustment. According to this mode, a period of time required for grasping the base station immediately after the power supply is turned on can be further reduced.

As was described above, according to the present invention, the reference frequency can be adjusted rapidly and accurately even in a case where the conventional reference frequency adjusting method is difficult to apply, such as a initial state at the time of turning on the power supply of the movable communication terminal using the CDMA system. Hence, the present invention can provide a mobile communication terminal which is capable of adjusting the reference frequency rapidly and accurately without using the TCXO which is expensive and high in accuracy.

Modifications of the invention herein disclosed will occur to a person skilled in the art and all such modifications are deemed to be within the scope of the invention as defined by the appended claims.

What is claimed is:

1. A mobile communication terminal, comprising:
   a receive circuit that receives an electric wave which is transmitted from a base station;
   a local signal generator that outputs a local signal to said receive circuit;
   a reference oscillator that transmits a reference signal that indicates a reference of an oscillation of said local signal generator;
   a reference oscillator controller that generates a control signal that controls the oscillation frequency of said reference oscillator;
   a demodulator that demodulates a signal received by said receive circuit;
   a base station searcher that inputs a demodulated signal output from said demodulator, that searches for an identifying signal in a frequency searching range, indicative of said base station, which is included in the demodulated signal to detect the presence/absence of said base station; and
   a frequency offset generator that generates an offset signal according to a search result of said base station searcher to change the control signal generated by said reference oscillator controller;
   wherein the oscillation frequency of said reference oscillator is shifted by a frequency offset amount determined by the offset signal for varying the frequency searching range of said base station by shifting the offset frequency amount.

2. A mobile communication terminal as claimed in claim 1, wherein when said base station searcher correctly detects the identifying signal indicative of the base station, said base station searcher stops said frequency offset generator from changing the control signal generated by said reference oscillator controller.

3. A mobile communication terminal as claimed in claim 2, wherein said base station searcher includes a frequency error detector that inputs the demodulated signal output from said demodulator for detecting an error in the oscillation frequency of said reference oscillator; and
   wherein after said base station searcher stops said frequency offset generator from changing the control signal of said reference oscillator controller, said reference oscillator controller changes the control signal according to a frequency error signal output by said frequency error detector to control the oscillation frequency of said reference oscillator.

4. A mobile communication terminal as claimed in claim 2, wherein said frequency offset generator further includes a storage that stores data when detecting a correct identifying signal indicative of the base station, and the data stored in said storage is used as an initial value for controlling the oscillation frequency at the time of conducting succeeding base station search.

5. A mobile communication terminal as claimed in claim 1, wherein said base station searcher includes a frequency error detector being input the demodulated signal from said demodulator for detecting an error in the oscillation frequency of said reference oscillator; and
   wherein after said base station searcher stops said frequency offset generator from changing the control signal of said reference oscillator controller, said reference oscillator controller changes the control signal according to a frequency error signal output by said frequency error detector to control the oscillation frequency of said reference oscillator.

6. A mobile communication terminal as claimed in claim 5, wherein said frequency offset generator further includes a storage that stores data when detecting a correct identifying signal indicative of the base station, and the data stored in said storage is used as an initial value for controlling the oscillation frequency at the time of conducting succeeding base station search.

7. A mobile communication terminal as claimed in claim 1, wherein said frequency offset generator further includes a storage that stores data when detecting a correct identifying signal indicative of the base station, and the data stored in said storage is used as an initial value for controlling the oscillation frequency at the time of conducting succeeding base station search.

8. A mobile communication terminal, comprising:
   a receive circuit that receives an electric wave which is transmitted from a base station;
   a local signal generator that outputs a local signal to said receive circuit;
   a reference oscillator that transmits a reference signal that indicates a reference of an oscillation of said local signal generator;
   a reference oscillator controller that generates a control signal that controls the oscillation frequency of said reference oscillator;
   a demodulator that demodulates a signal received by said receive circuit;
   a base station searcher that inputs a demodulated signal output from said demodulator, that searches for an identifying signal, indicative of said base station, which is included in the demodulated signal to detect the presence/absence of said base station; and
   a frequency offset generator that generates an offset signal according to a search result of said base station searcher to change the control signal generated by said reference oscillator controller,
   wherein the oscillation frequency of said reference oscillator is shifted by a frequency offset amount determined by the offset signal,
   wherein said frequency offset generator is set to output the offset signal to said reference oscillator so as to increase the oscillation frequency of said reference oscillator by a predetermined frequency amount with respect to an initial search frequency, when said base station searcher is not able to find the identifying signal within a fixed frequency range amount centered around the initial search frequency, and
   wherein said frequency offset generator is set to thereafter output the offset signal to said reference oscillator so as to decrease the oscillation frequency by the predetermined frequency amount with respect to the initial search frequency, when said base station searcher is not able to find the identifying signal within the fixed frequency range amount centered around a first frequency value that corresponds to the initial search frequency added to the predetermined frequency amount.

9. A mobile communication terminal, comprising:

a receive circuit that receives an electric wave which is transmitted from a base station;

a local signal generator that outputs a local signal to said receive circuit;

a reference oscillator that transmits a reference signal that indicates a reference of an oscillation of said local signal generator;

a reference oscillator controller that generates a control signal that controls the oscillation frequency of said reference oscillator;

a demodulator that demodulates a signal received by said receive circuit;

a base station searcher that inputs a demodulated signal output from said demodulator, that searches for an identifying signal, indicative of said base station, which is included in the demodulated signal to detect the presence/absence of said base station; and a frequency offset generator that generates an offset signal according to a search result of said base station searcher to change the control signal generated by said reference oscillator controller, wherein the oscillation frequency of said reference oscillator is shifted by a frequency offset amount determined by the offset signal, wherein the initial search frequency added to ½ of the fixed frequency range amount corresponds to a third frequency value that is slightly greater than a fourth frequency value that corresponds to ½ of the fixed frequency range amount subtracted from the first frequency value.

* * * * *